United States Patent [19]
Razouk et al.

[11] Patent Number: 5,581,110
[45] Date of Patent: Dec. 3, 1996

[54] INTEGRATED CIRCUIT WITH TRENCHES AND AN OXYGEN BARRIER LAYER

[75] Inventors: Reda R. Razouk, Sunnyvale; Kulwant S. Egan; Wipawan Yindeepol, both of San Jose; Waclaw C. Koscielniak, Santa Clara, all of Calif.

[73] Assignee: National Semiconductor Corporation, Santa Clara, Calif.

[21] Appl. No.: 516,114

[22] Filed: Aug. 17, 1995

Related U.S. Application Data

[63] Continuation of Ser. No. 273,676, Jul. 12, 1994, abandoned.

[51] Int. Cl.⁶ .................................................. H01L 27/12
[52] U.S. Cl. ...................... 257/513; 257/520; 257/641
[58] Field of Search ............................... 257/513, 520, 257/641, 510

[56] References Cited

U.S. PATENT DOCUMENTS

| | | | |
|---|---|---|---|
| 4,455,325 | 6/1984 | Razouk | 427/85 |
| 4,635,090 | 1/1987 | Tamaki et al. | 257/513 |
| 4,656,497 | 4/1987 | Rogers et al. | 257/397 |
| 4,725,562 | 2/1988 | El-Kareh et al. | 437/67 |
| 4,907,063 | 3/1990 | Okada et al. | 257/520 |
| 4,952,524 | 8/1990 | Lee et al. | 437/67 |
| 5,011,788 | 4/1991 | Kawaji et al. | 437/67 |
| 5,059,550 | 10/1991 | Tateoka et al. | 437/67 |
| 5,099,304 | 3/1992 | Takemura et al. | 257/520 |
| 5,148,257 | 9/1992 | Kishi | 257/520 |
| 5,384,280 | 1/1995 | Aoki et al. | 437/67 |

FOREIGN PATENT DOCUMENTS

| | | | |
|---|---|---|---|
| 0060785 | 9/1982 | European Pat. Off. | |
| 0186976 | 7/1986 | European Pat. Off. | |
| 0435550 | 7/1991 | European Pat. Off. | |
| 57-204144 | 12/1982 | Japan | H01L 21/76 |
| 60-249345 | 12/1985 | Japan | H01L 21/76 |
| 1-217941 | 8/1989 | Japan | H01L 21/76 |
| 5-190658 | 7/1993 | Japan | H01L 21/76 |

OTHER PUBLICATIONS

Wolf, Stanley "Silicon Processing For The VLSI ERA", vol. 1, pp. 407–409.

Toshio Ogino et al, A New Planarization Technique for LSI Fabrication Utilizing SiGe Film Oxidation, Jan., 1985, Japanese Journal of Applied Physics, vol. 24, No. 1, pp. 95–101.

IBM Technical Disclosure Bulletin, Process for Simultaneously Forming Poly/EPI Silicon Filled Deep and Shallow Isolation Trenches Having a CVD Oxide Cap, Dec. 1990, vol. 33 No. 7, pp. 388–392.

C. G. Jambotkar, Improved Polysilicon–Filled Trench Isolation, IBM Technical Disclosure Bulletin, Aug. 1984, vol. 27 No. 3, pp. 1481–1482.

*Primary Examiner*—Robert P. Limanek
*Attorney, Agent, or Firm*—Skjerven, Morrill, MacPherson, Franklin & Friel; Paul J. Winters; Kent B. Chambers

[57] ABSTRACT

A trench which has walls intersecting a surface of a semiconductor substrate and an oxidation/diffusion barrier layer lining the walls is disclosed. The oxidation/diffusion barrier extends over the edges of the trench to prevent, for example, stress defects in the trench corners and vertical bird's beak formation within the trench. A filler material such as polysilicon is deposited within the trench followed by the deposition of a planarizing layer over the trench. After heat is applied, the planarizing layer flows to form a planarized layer over the trench. Using high pressure and phosphosilicate glass for the planarizing layer, the planarizing layer flows appropriately at low temperatures for short times.

47 Claims, 5 Drawing Sheets

INTEGRATED CIRCUIT WITH TRENCHES AND AN OXYGEN BARRIER LAYER

This application is a continuation of application Ser. No. 08/273,676, filed Jul. 12, 1994 now abandoned.

BACKGROUND OF THE INVENTION

1. Field of the Invention

The present invention relates to the fabrication of integrated circuits having trenches, and particularly, to the filling of trenches, forming of a barrier layer, and planarizing a surface over the trenches.

2. Description of Related Art

The incorporation of multiple electrical devices on a single semiconductor wafer resulted in the advent of integrated circuit ("IC") technology. The fabrication of electrically isolated devices is critical in integrated circuit technology. The importance of effective isolation while allowing good surface planarity and occupying minimal space cannot be overemphasized.

In light of the need to isolate the electrical devices, various isolation technologies have been developed. An earlier method termed LOCOS (LOCal Oxidation of Silicon) was developed for PMOS and NMOS IC's to prevent the establishment of parasitic channels between adjacent devices thus providing inter-device isolation. LOCOS isolation involves the formation of a semirecessed oxide in the nonactive (or field) areas of the semiconductor substrate. Eventually, bipolar IC's employed a similar LOCOS isolation technology. However, well-known limitations are associated with LOCOS isolation such as the formation of bird's beak and non-planar surface topography. As device geometries reached submicron size, conventional LOCOS isolation technologies attained the limit of their effectiveness, and alternative isolation technologies were developed to increase the packing density of IC's. One such isolation technology developed involves a process of creating trench structures during IC fabrication. The utilization of trench structures to form electrical isolation areas accomplished several major goals including (1) isolation of transistors in bipolar circuits; (2) prevention of latchup and isolation of n-channel from p-channel devices in CMOS; and (3) usage as storage-capacitor structures in Random Access Memories.

The trench lining, filling, and planarization processes are important factors in the fabrication of desirable trench structures. For example, Rogers et al., U.S. Pat. No. 4,656,497 describes a process of forming an isolation trench in silicon, lining the trench walls, and filling the trench with silicon dioxide doped with impurities such as boron or phosphorus ("glass"). In order to avoid the presence of voids within the trench fill material and to form a planar surface, the glass is reflowed at atmospheric pressure and elevated temperatures of about 950° C. to 1,150° C. for about 30 minutes to four hours depending upon the glass thickness and the trench dimensions. Subsequently, the trench structure is again subjected to elevated temperatures of about 1,000° C. to 1,200° C. to outgas the phosphorus or boron impurities.

Another example, Lee et al., U.S. Pat. No. 4,952,524 describes a process of forming an isolation trench in a silicon wafer, lining the trench walls, and also filling the trench with an oxide filler material deposited on a thermal stress-relief layer of oxide. Subsequently, the trench fill material is flowed to remove voids and form a planar surface at atmospheric pressure at an elevated temperature preferably higher than the temperatures of all subsequent furnace heat treatments to which the wafer will be subjected.

However, the trenches have contacts between layers of silicon and silicon dioxide. Because of the differing thermal coefficients of expansion of silicon and silicon dioxide and the subjection of the trench structure to the elevated temperatures for relatively long periods of time, stress from the mismatch occurs. This stress tends to cause undesirable damage in silicon areas near the trench. Particularly, top edges of the trenches are susceptible to the generation of stress defects. Additionally, the wafers often contain relatively defined regions of dopant concentrations for active devices prior to the creation of a trench(es). As a result, subjecting the wafer to elevated temperatures for relatively long periods of time can result in the undesirable movement of the dopants outside of the defined regions. Dopant redistribution requires an increase in minimum device separation which in turn decreases device density.

Polysilicon filled trenches are an alternative to oxide filled trenches i.e. after the formation of the trench and lining the trench walls, the trench is filled with polysilicon. However, surface planarity is generally achieved by etching back the polysilicon, capping the structure using LOCOS techniques, and then etching back the LOCOS. Therefore, a very complex combination of multiple process steps is required to achieve surface planarity. Additionally, a diffusion/oxidation barrier such as silicon nitride is often used to line a trench prior to filling of the trench. The LOCOS technique tends to generate a vertical bird's beak in the area lying between the silicon wafer and the barrier layer. The vertical bird's beak will generate undesirable stress defects at the top edges of the trench.

SUMMARY OF THE INVENTION

The present invention overcomes the disadvantages of the related art by providing the advantages of a simple process with few process steps, a low thermal budget, excellent surface planarity, the elimination of stress defects especially at the trench corners, the minimization of dopant redistribution, and a vertical bird's beak free trench.

The present invention is an integrated circuit body with an orifice disposed in the body. The orifice has a wall intersecting a surface of the body to form a corner. A diffusion barrier is present and has a portion extending from the orifice onto the surface to overlap the corner. Fill material is disposed in the orifice. A layer of dielectric material is disposed over the surface of the body, over the orifice, and over the extending portion of the diffusion barrier.

In another embodiment, the present invention is a method of filling an orifice disposed in a semiconductor body which has an orifice opening onto a surface thereof. The method is accomplished by forming a diffusion barrier layer on part of the surface of the semiconductor body contiguous to the orifice opening so that a portion of the oxygen diffusion barrier layer extends from the orifice opening. A filler material is also deposited into the orifice and a dielectric layer is deposited over the filler material and over the portion of the diffusion barrier layer extending from the orifice opening.

BRIEF DESCRIPTION OF THE DRAWINGS

Reference numerals referring to the same features appearing in multiple figures are the same.

DETAILED DESCRIPTION OF THE PREFERRED EMBODIMENT

Figure 1:
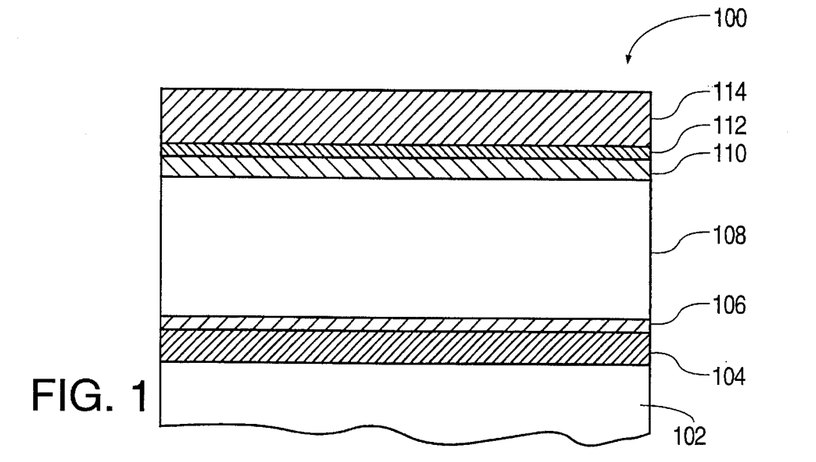
FIGS. 1 through 12 illustrate cross sectional representations of a portion of semiconductor wafer at successive steps in a process for fabricating the trench structure and a planarized surface.

Beginning with FIG. 1, a cross-sectional view of semiconductor wafer 100 in various stages of fabrication is depicted. Wafer 100 is formed by bonding a handle wafer (e.g. p$^-$ substrate 102) with a device wafer (e.g. n$^+$ buried layer 106 and silicon device layer 108) using a suitable bonding process. Suitable bonding processes are well known to those of ordinary skill in the art, and include silicon bonding with other materials such as sapphire and quartz as discussed in Imthurn, Garica, Walker and Forbes "Bonded Silicon-on-sapphire Wafers and Devices" *Journal of Appl. Physics* 72(6), Sep. 15, 1992 and in Abe, Sunagawa, Uchiyama, Yoshizawa, and Nakazato "Fabrication and Bonding Strength of Bonded Silicon-Quartz Wafers" *Jpan. Journal of Appl. Physics* Vol. 32, 1993, pp. 334–337, respectively. A semiconductor wafer 100 incorporating a p- or n-type substrate 102, a 1 μm oxide bonding layer 104, an n$^+$ buried layer 106, and a silicon device layer 108 provide an appropriate starting platform for the trench formation. The combined dimensions of device layer 108 and n$^+$ buried layer 106 are 12 μm. Although the existence of specific layers, dopant types, and dimensions have been particularly described, other wafers and parameters will be acceptable. For example, the depth of device layer 108 may be as shallow or deep as that necessary to fabricate active devices. Other suitable wafers may incorporate more or less layers, varying doping materials and concentrations, and varying layer dimensions along with other attributes known to be useful in the fabrication of IC's.

Figure 2:
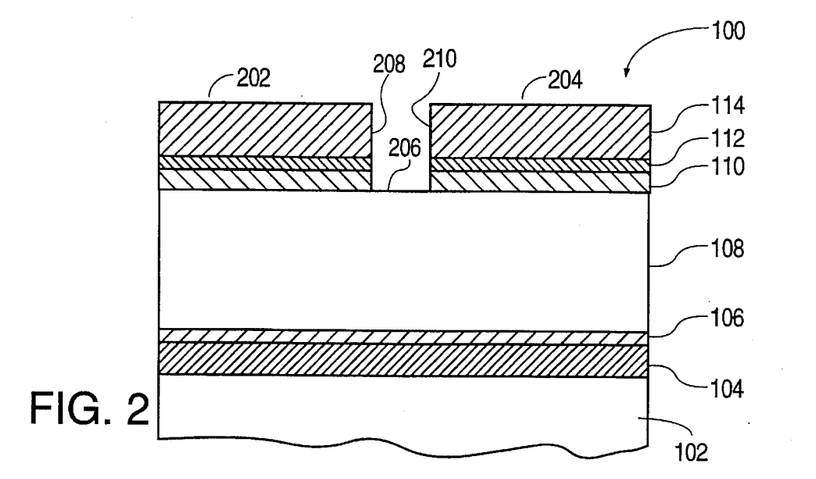

The trench forming process begins with the formation of a hard mask characterized by a 1000 Å thermal silicon dioxide layer 110 ("thermal oxide"), a 300 Å silicon nitride (Si$_3$N$_4$) ("Nitride") layer 112, and a 5000 Å low temperature silicon dioxide layer ("LTO") layer 114, the formations of which are well known to those skilled in the art. LTO layer 114 should be of a minimum sufficient thickness to protect the underlying layers during a subsequent etching of device layer 108 described below in conjunction with FIG. 3. Following the formation of the hard mask, a photoresist layer (not shown) is applied on top of LTO 114. The photoresist layer may be developed by conventional techniques so as to mask the areas defined by LTO surfaces 202 and 204 as shown in FIG. 2 i.e. the areas where the trench will not be located. The area between LTO surfaces 202 and 204 defines the location and width of the trench to be formed. Next, an anisotropic etch is used to etch through the hard mask forming an opening between LTO surfaces 202 and 204 and exposing surface 206 of device layer 108 as shown in FIG. 2. LTO surfaces 202 and 204 remain substantially unetched due to the masking effect of the photoresist. The photoresist layer (not shown) is subsequently removed by conventional techniques.

Figure 3:
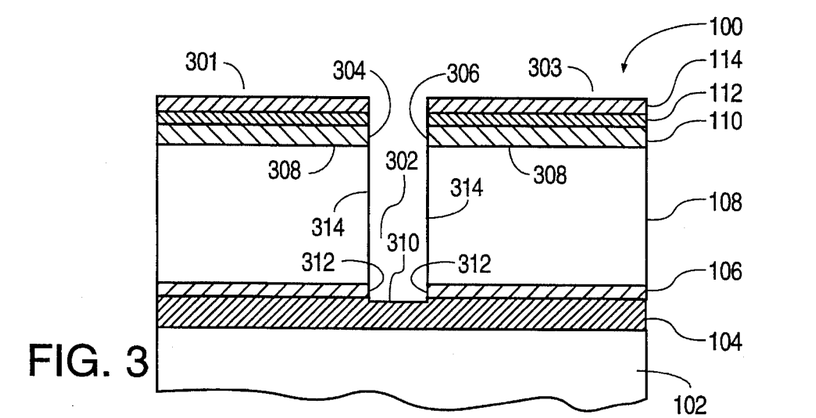

Wafer 100 is now ready for trench etching. Referring to FIG. 3, the device layer 108 and, n$^+$ buried layer 106, are anisotropically etched down to silicon dioxide layer 104 in order to provide effective electrical isolation between adjacent electrical device regions 301 and 303. A conventional reactive ion etch process may be used. The previously formed hard mask effectively prevents etching of the device layer 108 beneath LTO surfaces 202 and 204. The trench etching process removes approximately 3000 Å of the original 5000 Å of LTO layer 114. The trench walls 314 and bottom 310 form corners 312 following the reactive ion etching process. The corners 312 are generally perpendicular when using a bonded wafer but may be rounded when other types of wafers are used. The anisotropic etching process results in the formation of trench 302 which, illustratively, has a depth of 12 μm measured from the surface 308 of device layer 108 to the bottom 310 of trench 302, a width of about 2.0 μm and an aspect ratio of about 6. Additionally, the minimum trench depth is set by the maximum depth of the active devices fabricated in device layer 108.

Figure 4:
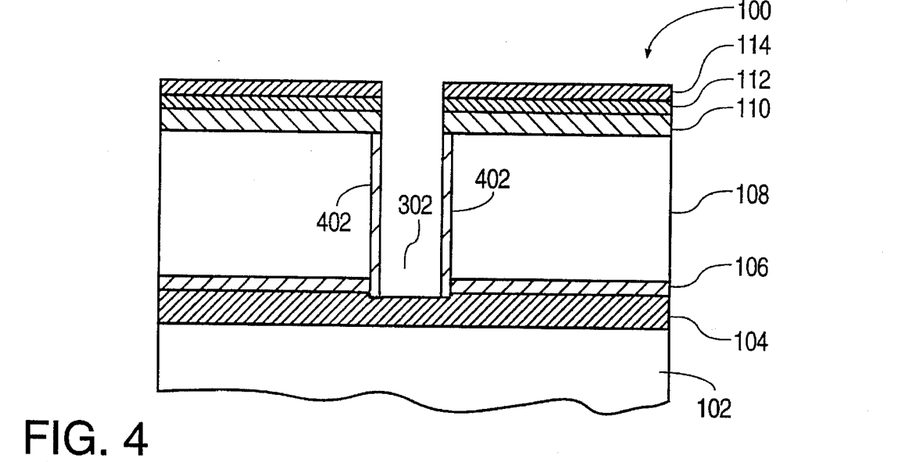
Figure 5:
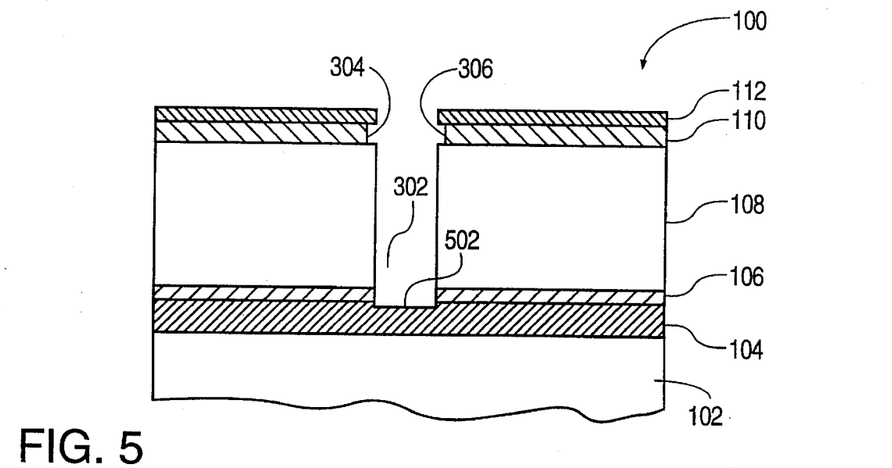

Referring now to FIG. 4, a 500 Å sacrificial oxide 402 is grown along the trench wall to remove defects. The sacrificial oxide and the top residual layer of the LTO layer 114 are then etched off using a hydrofluoric acid (HF) based wet etch resulting in the structure illustrated in FIG. 5. The nitride layer 112 prevents oxidation from occurring beneath it and thus serves as an oxidation mask. Although the nitride layer 112 protects the majority of thermal oxide layer 110 from the LTO layer 114 removal etching process, surfaces 304 and 306 of thermal oxide layer 110 are unprotected by the hard mask and susceptible to etching. Thus unprotected surfaces 304 and 306 are depicted in FIG. 5 as being laterally receded beneath nitride layer 112. Additionally, the 1 μm oxide layer 104 will be slightly affected at trench 302 bottom 502 following removal of LTO layer 114 and sacrificial layer 402. However, the recision at bottom 502 may be eliminated by using other wafer platforms which do not contain the 1 μm oxide layer 104.

Figure 6:
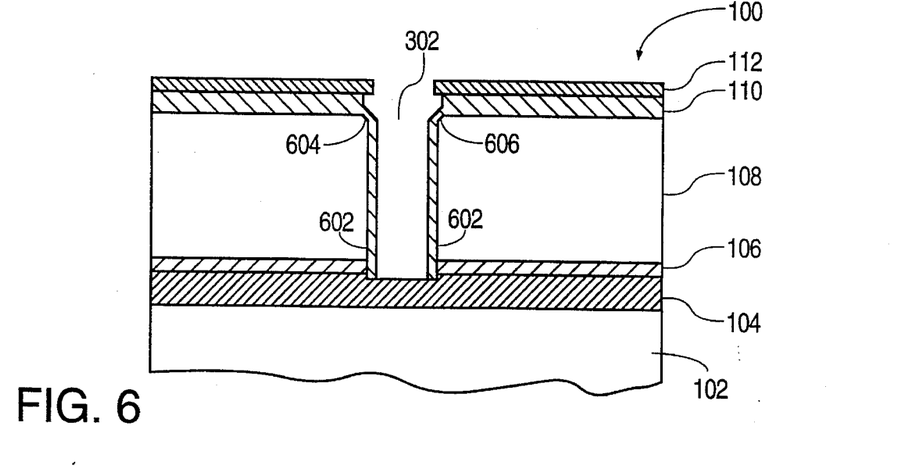

Next, as shown in FIG. 6, following the removal of the LTO layer, a 500 Å thin silicon dioxide ("pad oxide") layer 602 is subsequently grown within trench 302 and lines trench 302. The pad oxide 602 growth process involves the reaction of Si(solid) with oxygen (O$_2$) (vapor) and is accomplished using a Bruce Technologies 7351 furnace manufactured by Bruce Technologies, International, a North Billerica, Mass. company, at 1050° C. and atmospheric pressure for about 20 minutes. Because of the thinness of the pad oxide 602, any bird's beak formed under nitride layer 112 is of a negligible size and is not a concern. Additionally, the thin pad oxide 602 should be thin enough to alleviate concerns of introducing stress at the corners 604 and 606 of trench 302 during temperature cycles of subsequent fabrication steps. Furthermore, thin pad oxide 602 requires relatively minimal growth time which minimizes the opportunity for dopant redistribution in areas occupied by electrical circuit elements (not shown).

The thin pad oxide 602 will proceed to uniformly grow in the areas having an exposed silicon surface. Because some of the device layer 108 silicon is consumed by the pad oxide 602 growth process, the corners 604 and 606 of device layer 108 are rounded. The nitride layer 112 prevents the growth of an oxide layer underneath the nitride layer 112 with the exception of thin pad oxide 602 growth in the area of corners 604 and 606.

Figure 7:
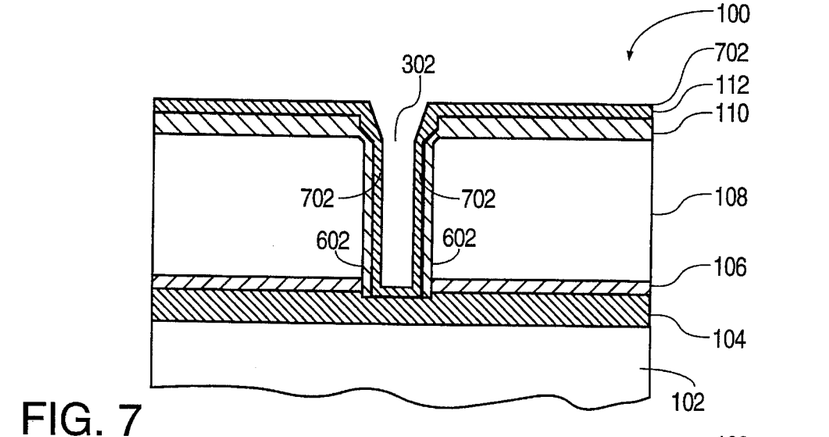

As depicted in FIG. 7, following the growth of the pad oxide 602, a thin 300 Å nitride layer 702 is conformally deposited on existing nitride layer 112 and on the pad oxide 602 within trench 302. The nitride layer 702 deposition involves the reaction of dichlorosilane (SiCl$_2$H$_2$) and ammonia (NH$_3$) to form silicon nitride, hydrochloric acid (HCl)

and hydrogen ($H_2$). The nitride layer 702 deposition process is accomplished using a Pacific Western System Model CDS-1 manufactured by Pacific Western System, a Mountain View, Calif. company, at 800° C. and 340 mTorr for about 3 minutes and 30 seconds. The thin nitride layer 702 lines the trench 302 walls and bottom and serves to prevent further oxidation of device layer 108 and to minimize vertical bird's beak formation in subsequent processing steps.

Figure 8:
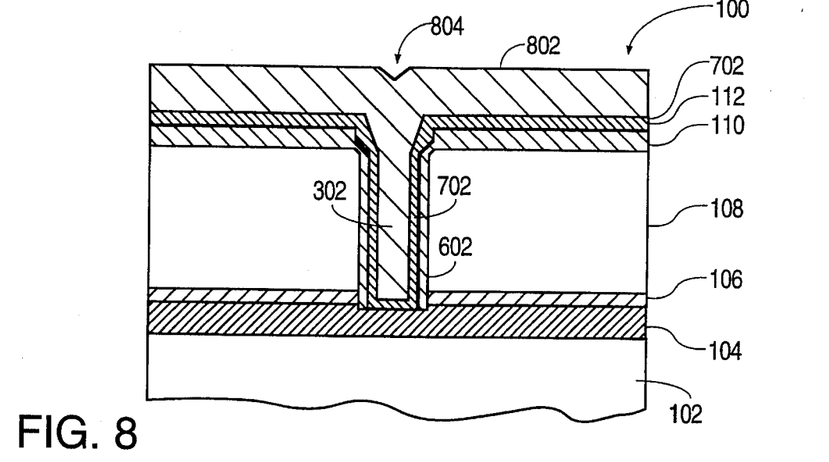

Referring now to FIG. 8, a layer of polysilicon 802 is deposited by means of low pressure chemical vapor deposition so that it completely fills trench 302 and eventually rises 1.5 μm above nitride layer 702 so that the bottom of cusp 804 is above the opening of trench 302. The polysilicon 802 deposition involves the decomposition of silane ($SiH_4$) and is accomplished using a Bruce Technologies 7351 furnace and Advanced Crystal Sciences gas flow tubing apparatus, manufactured by Advanced Crystal Sciences, Inc., a San Jose, Calif. company, respectively, at 625° C. and 250 mTorr for about 3 minutes and 30 seconds. As a result of having the same thermal expansion coefficient, polysilicon trench material 802 and the silicon device layer 108 experience lower stresses during subsequent processing steps than trenches filled with material(s) having a higher thermal expansion coefficient than the device layer. During the polysilicon filling process, the thickness of the deposited polysilicon 802 increases on the trench walls 302 until the polysilicon 802 deposited on the walls of trench 302 meet and initially form a seam. The seam closes as trench 302 is filled resulting in a void-free trench. Additionally, during the filling of trench 302, a cusp 804, associated with the closure of the seam between the two meeting surfaces of polysilicon, forms above the central region of the trench 302. The filling of trench 302 with polysilicon results in a trench having an absence of voids.

Figure 9:
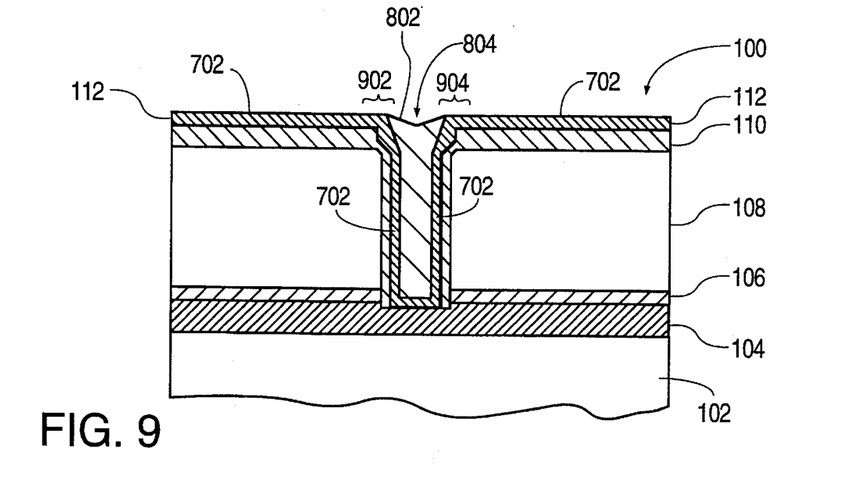

Next, as illustrated in FIG. 9, the polysilicon layer 802 above nitride layer 702 and above trench 302 is etched back. Polysilicon layer 802 is etched using a reactive ion etch process with the etch ending at the polysilicon layer 802-nitride layer 702 interface. The polysilicon layer 802 etch process is accomplished using a LAM490, manufactured by Lam Research Corp., a Fremont, Calif. company, with $O_2$ and HCl at 20° C. and 650 mTorr for about 9–10 minutes. Because the etch rate of polysilicon layer 802 is approximately uniform on all exposed surfaces, cusp 804 remains. The surface of polysilicon layer 802 is accordingly non-planar at this point in the fabrication process.

Figure 10:
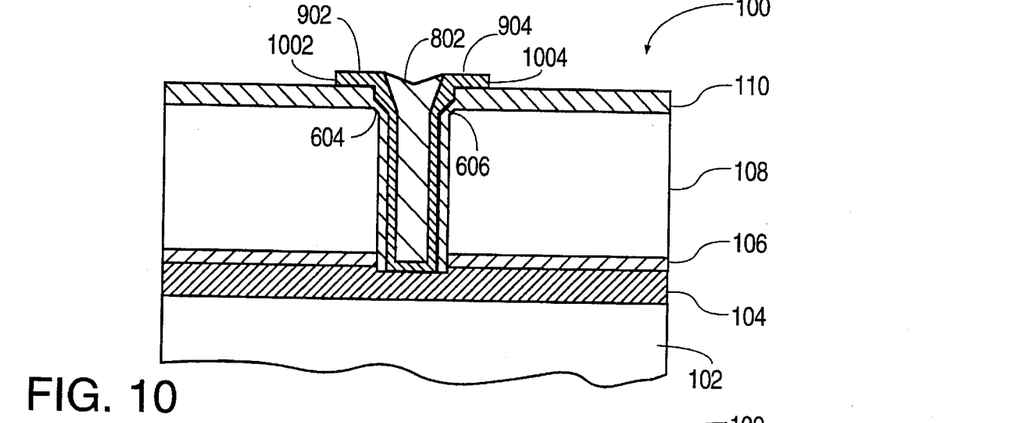

Referring to FIG. 9, a layer of photoresist (not shown) is applied and developed by conventional techniques to protect the surfaces 902 and 904 of nitride layer 702 extending from trench 302 and residing along the perimeter of trench 302 and to protect the polysilicon trench fill material 802. The photoresist mask is a reverse oversized trench mask. Referring now to FIG. 10, the unprotected nitride layer is subsequently removed by etching, leaving only the nitride layers 1002 and 1004 overlapping the sides of trench 302 onto oxide 110 as shown in FIG. 10. The overlapping nitride layers 1002 and 1004 have a lateral dimension of about 1 μm. The unprotected nitride layer etch process is accomplished using a LAM490, manufactured by Lam Research Corp., a Fremont, Calif. company, with $SF_6$ and $O_2$ at 20° C. and 275 mTorr for about 20 seconds. The photoresist mask was intentionally oversized so as to substantially protect the nitride beneath surfaces 902 and 904 thus forming overlapping nitride layers 1002 and 1004 which remain on a region of the semiconductor body contiguous with the opening of trench 302. The overlapping nitride layer 1004 forms a diffusion barrier which prevents oxidation of the corners 604 and 606 at the trench walls and the formation of vertical bird's beak between the nitride layer 702 and the device layer 108 during subsequent integrated circuit process steps facilitating oxidation such as field oxide growth steps.

Figure 11:
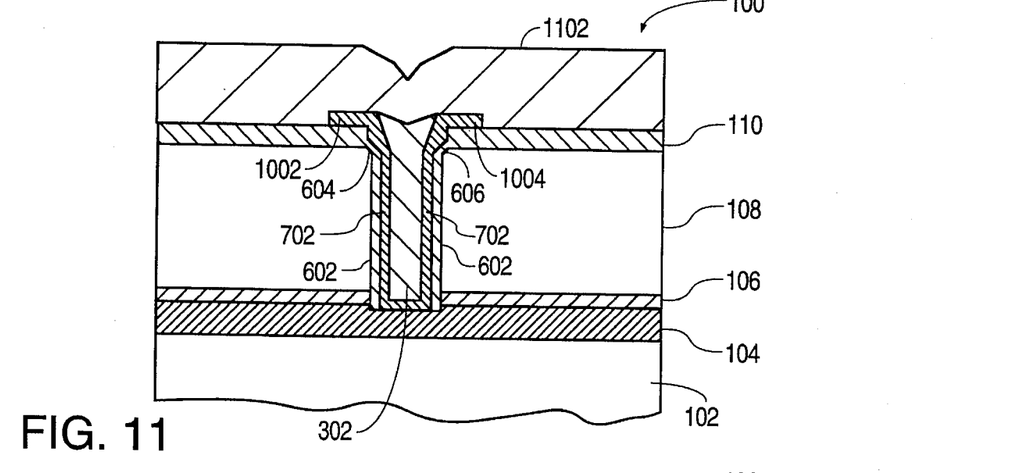

Referring now to FIG. 11, in order to achieve a planar surface, a 6% Phosphorus doped LTO layer 1102 (phosphosilicate glass or "PSG") is deposited on top of the wafer 100 to a depth of 7000 Å as shown in FIG. 11; however, the range may vary, for example from 4000 Å to 8000 Å, as necessary to provide sufficient oxide for subsequent processing and to minimize non-planarity. The low temperature deposition of $SiO_2$ involves a reaction of silane and oxygen to form undoped $SiO_2$ films. The addition of phosphine ($PH_3$) to the gas flow forms phosphoric anhydride ($P_2O_5$), which is incorporated into the $SiO_2$ film to produce the Phosphosilicate glass. Other compounds and varying concentrations may be substituted for the 6% Phosphorus doped LTO. For example, the concentration of Phosphorus may increase above 6% to about 9%. Also, it will be appreciated that the use of borophosphosilicate glass will reduce the flow temperatures and duration over that necessary when reflowing undoped LTO at atmospheric pressure. Further, a doping of some of the Silicon in the LTO with Germanium will have similar effects. Note that the presence of overlapping nitride layers 1002 and 1004 prevents oxidation of underlying features and accompanying characteristics such as stress defects at the corners 604 and 606 and vertical birds beak formation between nitride layer 702 and oxide layer 602 within trench 302.

Figure 12:
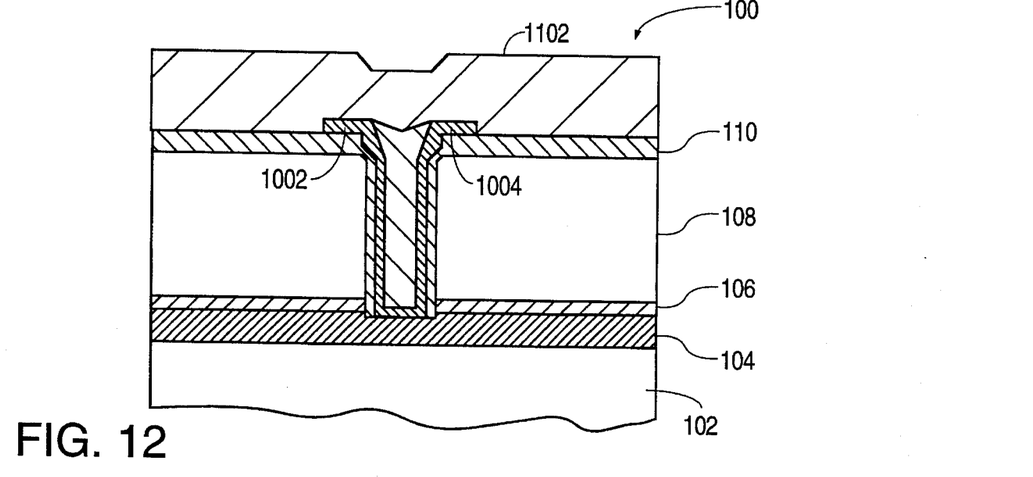

Referring now to FIG. 12, the PSG 1102 exhibits a substantially planar surface following a reflow procedure thereby providing a planarized trench. Using a High Pressure Oxidation ("HIPOX") furnace, the PSG is reflowed in a steam ambient at a temperature of 950° C. +/−2° C. and a pressure of 25 atmospheres for 3–5 minutes. As a result of using the HIPOX furnace, the PSG may be reflowed at relatively low temperatures for a shorter duration than necessary when reflowing oxide at atmospheric pressure. The details of the PSG flow process in a high pressure environment are described in Razouk, U.S. Pat. No. 4,455,325 which is incorporated herein by reference. As a result, stress defects arising from thermal expansions and undesirable dopant movements are reduced if not eliminated. The reduction of dopant movements allows for reducing the separation between doped regions of circuit devices which increases device density. Furthermore, the relatively short duration of the elevated flow temperature results in energy cost savings due to a low thermal budget over processes utilizing high temperatures for relatively long periods of time. Additionally, due to the presence of the nitride layers 1002 and 1004, the minimization of defect generation at the trench corners due to oxidation during reflow is achieved.

Figure 13:
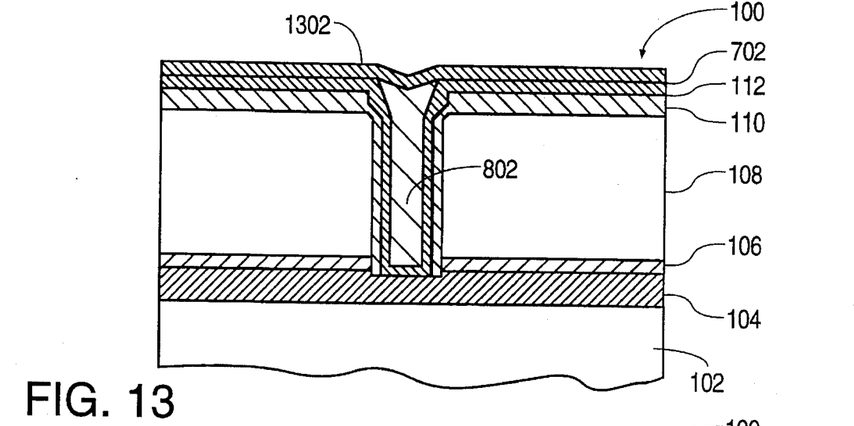
FIGS. 13 through 15 illustrate a cross sectional representation of an alternative structure which may be used in conjunction with the structure and process of FIGS. 1–12.

Referring now to FIG. 13, the above process may be modified by inserting a process step of depositing an additional 300 Å layer of nitride 1302 following the polysilicon layer 802 etching process. The nitride layer 1302 may be deposited using the same process as the deposition of nitride layer 702. The nitride layer 1302 will prevent any oxidation of the polysilicon 802 within the trench 302 during reflow of the LTO layer 1102. The presence of nitride layer 1302 will further minimize the generation of stress defects during the subsequent reflow of LTO layer 1102.

Figure 14:
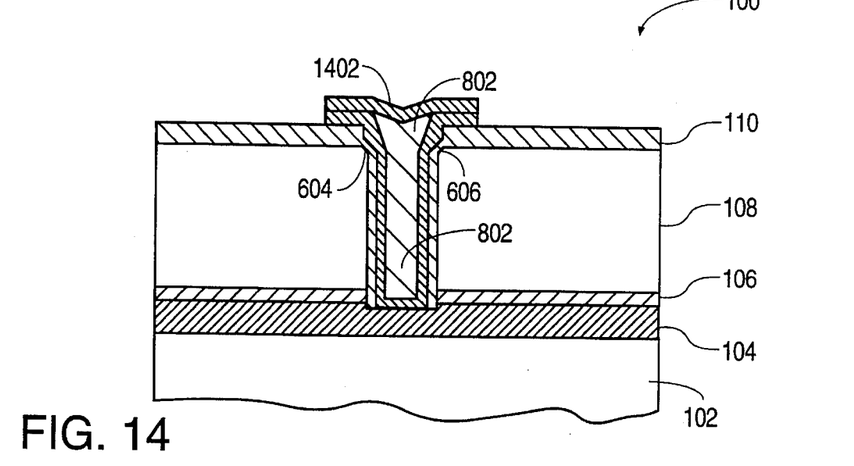

If the additional step illustrated by FIG. 13 is inserted, the formation of the oversized trench mask shown in FIG. 14 and subsequent etching process will result in the structure illustrated in FIG. 14 rather than the structure in FIG. 10.

Figure 15:
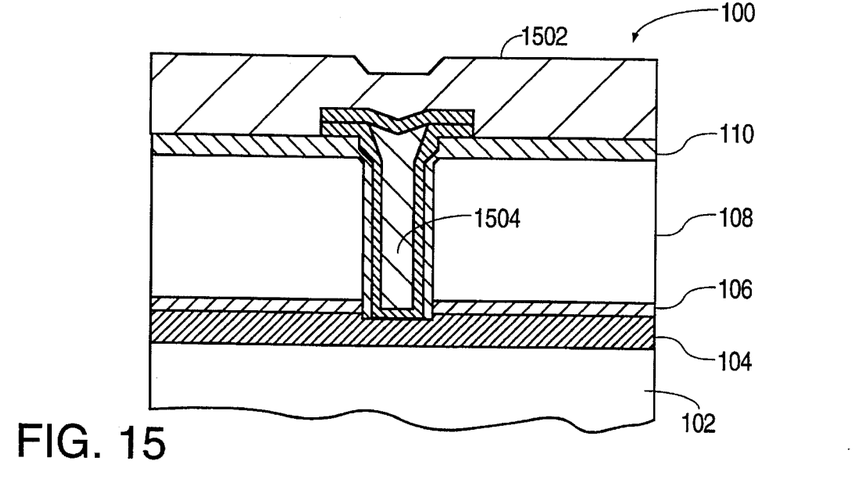

The structure of FIG. 14 has a nitride cap 1402 which provides double protection of oxidation of the corners 604 and 606 and prevents the oxidation of the polysilicon trench fill material 802. The fabrication process associated with FIGS. 11 and 12 may now continue as previously described and results in the planarized trench shown in FIG. 15.

In another embodiment, both the FIG. 5 trench and the FIG. 6 trench proceed directly to the filling step illustrated in FIG. 8. Next, the polysilicon is etched down to silicon oxide layer 110, and a layer of silicon nitride is deposited. The nitride over the corners of trench 302 is protected by a conventional etch mask while the remaining nitride is removed in an etch step. Alternatively, a continuous layer of silicon nitride forming a cap overlying the trench and the trench corners may be protected by a reverse oversized trench mask while the remaining nitride is removed in an etch step.

Referring now to FIG. 12, the semiconductor with trench 302 planarized doped LTO layer 1102 is now ready for the fabrication of integrated circuit elements (not shown). (Note: the semiconductor with the trench 1504 illustrated in FIG. 15 with doped LTO layer 1502 is also now ready for the fabrication of integrated circuit elements). In order to form the integrated circuit elements, a masking layer is applied over the doped LTO layer 1102. The unprotected portions of the doped LTO layer 1102 and oxide layer 110 are etched to device layer 108. The exposed areas of device layer 108 are used to form the integrated circuit elements using dopant implantation or other conventional technologies. Alternatively, the trench 302 may be formed and doped LTO layer 1102 planarized following the fabrication of integrated circuit elements (not shown). In this event, a masking layer is applied over doped LTO layer 1102 in FIG. 12. The unprotected portions of the doped layer 1102 and oxide layer 110 are etched to device layer 108 forming contact/via holes which may be filled using conventional contact/via filling technologies.

The barrier layer and planarization techniques described above may also be used with other trench wall profiles such as non-vertical walls, tapered walls, and curved walls which may be formed using conventional process technologies. The process described may be used in conjunction with bipolar, MOS, CMOS, as well as other process technologies. Additionally, the described process may be used in conjunction with National Semiconductor's LB250T product line.

Accordingly, various other embodiments and modifications and improvements not described herein may be within the spirit and scope of the invention, as defined by the following claims.

What is claimed is:

1. An integrated circuit body comprising:
   an orifice disposed in the body, the orifice having a wall intersecting a surface of the body to form a corner;
   an oxygen diffusion barrier entirely lining the orifice wall, extending from the orifice onto the surface, and terminating proximate to the corner to overlap the corner;
   fill material disposed in the orifice;
   a layer of dielectric material disposed over the surface of the body, over the orifice, and over the extending portion of the oxygen diffusion barrier; and
   a second oxygen diffusion barrier disposed on the fill material and on the extending portion of the oxygen diffusion barrier and interposed between the fill material and the dielectric material.

2. An integrated circuit body as in claim 1, wherein the oxygen diffusion barrier is disposed on the wall of the orifice and the fill material is disposed inside of the oxygen diffusion barrier.

3. An integrated circuit body as in claim 1, wherein the integrated circuit body is silicon, the oxygen diffusion barrier is silicon nitride, the wall of the orifice is silicon dioxide, the fill material is polysilicon, and the dielectric material is reflowed phosphosilicate glass having a 6 percent concentration of phosphorus.

4. A semiconductor body comprising:
   a trench disposed in the semiconductor body, the trench having a side wall intersecting a surface of the semiconductor, wherein the semiconductor body includes a surface region contiguous to the side wall;
   a stress relief layer disposed entirely over the side wall and over the semiconductor body contiguous surface region;
   an oxygen diffusion barrier disposed entirely over the stress relief layer and terminating over the semiconductor body contiguous surface region;
   a trench fill material disposed in the trench; and
   a layer of flowed planarization material disposed over the surface of the semiconductor body, over the trench, and over the oxygen diffusion barrier.

5. A semiconductor body as in claim 4, wherein the stress relief layer is silicon dioxide.

6. An integrated circuit body as in claim 1 wherein the orifice includes a second wall intersecting the surface of the body to form a second corner, the oxygen diffusion barrier having a second portion extending from the orifice and onto the second surface to overlap the second corner and terminating proximate to the second corner.

7. An integrated circuit body comprising:
   an orifice disposed in the body, the orifice having a wall intersecting a surface of the body to form a corner;
   an oxygen diffusion barrier entirely lining the orifice wall, extending from the orifice onto the surface, and terminating proximate to the corner to overlap the corner;
   fill material disposed in the orifice; and
   a layer of dielectric material disposed over the surface of the body, over the orifice, and over the extending portion of the oxygen diffusion barrier, wherein the extending portion of the oxygen diffusion barrier has a lateral dimension of about 1 µm.

8. An integrated circuit body as in claim 1 wherein the fill material includes a surface facing away from an interior of the body, and the layer of dielectric material is disposed on the extending portion of the oxygen diffusion barrier and on the fill material surface.

9. A semiconductor body as in claim 4 wherein the portion of the oxygen diffusion barrier disposed over the semiconductor body contiguous surface region has a lateral dimension of about 1 µm.

10. An integrated circuit body comprising:
    an orifice disposed in the body, the orifice having a wall intersecting a surface of the body to form a corner;
    an oxygen diffusion barrier entirely lining the orifice wall, extending from the orifice onto the surface, and terminating proximate to the corner to overlap the corner;
    fill material disposed in the orifice;
    a layer of dielectric material disposed over the surface of the body, over the orifice, and over the extending portion of the oxygen diffusion barrier; and
    a second oxygen diffusion barrier disposed on the fill material and on the extending portions of the oxygen diffusion barrier and interposed between the fill material and the dielectric material.

11. A semiconductor body comprising:
  a trench disposed in the semiconductor body, the trench having a side wall intersecting a surface of the semiconductor, wherein the semiconductor body includes a surface region contiguous to the side wall;
  a stress relief layer disposed over the side wall and over the semiconductor body contiguous surface region;
  a first silicon nitride layer having a side wall portion disposed on the stress relief layer within the trench and an overlap portion disposed on the stress relief layer, the overlap portion terminating over the semiconductor body contiguous surface region;
  a trench fill material disposed on the first silicon nitride side wall portion and filling the trench, the trench fill material having a crest surface adjacent to the first silicon nitride overlap portion;
  a second silicon nitride layer disposed on the first silicon nitride overlap portion and on the trench fill material crest surface; and
  a layer of flowed planarization material disposed on the second silicon nitride layer.

12. The semiconductor body of claim 11 wherein the first silicon nitride layer overlap portion has a lateral dimension of about 1 µm.

13. An integrated circuit body comprising:
  a groove disposed in the body, the groove having a wall intersecting a surface of the body;
  a pad oxide formed on the wall of the groove and on a surface region of the body contiguous with the groove;
  a first silicon nitride layer formed on the pad oxide to cover the pad oxide within the groove and extending from the groove to cover at least a portion of the pad oxide external to the groove, the first silicon nitride layer terminating over the surface region of the body contiguous with the groove;
  a polysilicon layer formed within the groove on the first silicon nitride layer to fill the groove and having a surface facing outwardly from the groove;
  a layer of dielectric material disposed over the first silicon nitride layer and the polysilicon layer; and
  a second silicon nitride layer formed on the first silicon nitride layer extending from the groove and on the polysilicon layer surface, the second silicon nitride layer terminating over the surface region of the body contiguous with the groove;
  wherein the layer of dielectric material is disposed on the second silicon nitride layer.

14. An integrated circuit body comprising:
  a groove disposed in the body, the groove having a wall intersecting a surface of the body;
  a pad oxide formed on the wall of the groove and on a surface region of the body contiguous with the groove;
  a first silicon nitride layer formed on the pad oxide to cover the pad oxide within the groove and extending from the groove to cover at least a portion of the pad oxide external to the groove, the first silicon nitride layer terminating over the surface region of the body contiguous with the groove;
  a polysilicon layer formed within the groove on the first silicon nitride layer to fill the groove and having a surface facing outwardly from the groove;
  a layer of dielectric material disposed over the first silicon nitride layer and the polysilicon layer; and
  wherein the first silicon nitride layer terminates about 1 µm from the intersection of the groove wall and the surface of the body.

15. An integrated circuit body as in claim 13 wherein the first and second silicon nitride layers terminate about 1 µm from the intersection of the groove wall and the surface of the body.

16. A semiconductor body comprising:
  a trench disposed in the semiconductor body, the trench having a side wall intersecting a surface of the semiconductor;
  a first continuous oxygen diffusion barrier entirely lining the trench side wall and terminating on the semiconductor surface proximate to the intersection of the semiconductor surface and the trench side wall;
  a trench fill material disposed on the first oxygen diffusion barrier within the trench and filling the trench, the trench fill material having an exposed top surface; and
  a layer of flowed planarization material over the surface of the semiconductor body, over the trench, and over the first oxygen diffusion barrier.

17. The semiconductor body of claim 16 further comprising:
  a second continuous oxygen diffusion barrier disposed on the first continuous oxygen diffusion barrier over the semiconductor surface and on the exposed top surface of the trench fill material.

18. A semiconductor body as in claim 16, wherein the semiconductor body is silicon, the oxygen diffusion barrier is silicon nitride, the side wall of the trench is silicon dioxide, the trench fill material is polysilicon, and the dielectric material is reflowed phosphosilicate glass having a 6 percent concentration of phosphorus.

19. The semiconductor body of claim 16 wherein the layer of flowed planarization material is disposed on the first continuous oxygen diffusion barrier and on the exposed top surface of the trench fill material.

20. An integrated circuit body comprising:
  an orifice disposed in the body, the orifice having a wall intersecting a surface of the body to form a corner;
  a first oxygen diffusion barrier having a portion extending from the orifice and onto the surface to overlap the corner;
  fill material disposed in the orifice;
  a second oxygen diffusion barrier disposed over the fill material and interposed between the fill material and the dielectric material; and
  a layer of dielectric material disposed over the surface of the body, over the orifice, over the extending portion of the first oxygen diffusion barrier, and over the second oxygen barrier.

21. An integrated circuit body as in claim 7, wherein the oxygen diffusion barrier is disposed on the wall of the orifice and the fill material is disposed inside of the oxygen diffusion barrier.

22. An integrated circuit body as in claim 7, wherein the integrated circuit body is silicon, the oxygen diffusion barrier is silicon nitride, the wall of the orifice is silicon dioxide, the fill material is polysilicon, and the dielectric material is reflowed phosphosilicate glass having a 6 percent concentration of phosphorus.

23. An integrated circuit body as in claim 7, further comprising:
  a second oxygen diffusion barrier disposed on the fill material and on the extending portion of the oxygen diffusion barrier and interposed between the fill material and the dielectric material.

24. An integrated circuit body as in claim 7 wherein the orifice includes a second wall intersecting the surface of the body to form a second corner, the oxygen diffusion barrier having a second portion extending from the orifice and onto the second surface to overlap the second corner and terminating proximate to the second corner.

25. An integrated circuit body as in claim 7 wherein the fill material includes a surface facing away from an interior of the body, and the layer of dielectric material is disposed on the extending portion of the oxygen diffusion barrier and on the fill material surface.

26. An integrated circuit body as in claim 7, further comprising:
   a second oxygen diffusion barrier disposed on the fill material and on the extending portions of the oxygen diffusion barrier and interposed between the fill material and the dielectric material.

27. An integrated circuit body as in claim 10, wherein the oxygen diffusion barrier is disposed on the wall of the orifice and the fill material is disposed inside of the oxygen diffusion barrier.

28. An integrated circuit body as in claim 10, wherein the integrated circuit body is silicon, the oxygen diffusion barrier is silicon nitride, the wall of the orifice is silicon dioxide, the fill material is polysilicon, and the dielectric material is reflowed phosphosilicate glass having a 6 percent concentration of phosphorus.

29. An integrated circuit body as in claim 10, further comprising:
   a second oxygen diffusion barrier disposed on the fill material and on the extending portion of the oxygen diffusion barrier and interposed between the fill material and the dielectric material.

30. An integrated circuit body as in claim 10 wherein the orifice includes a second wall intersecting the surface of the body to form a second corner, the oxygen diffusion barrier having a second portion extending from the orifice and onto the second surface to overlap the second corner and terminating proximate to the second corner.

31. An integrated circuit body as in claim 10 wherein the fill material includes a surface facing away from an interior of the body, and the layer of dielectric material is disposed on the extending portion of the oxygen diffusion barrier and on the fill material surface.

32. An integrated circuit body as in claim 13 wherein the first silicon nitride layer terminates about 1 μm from the intersection of the groove wall and the surface of the body.

33. A semiconductor body as in claim 4, wherein the semiconductor body includes silicon, the oxygen diffusion barrier is silicon nitride, the fill material is polysilicon, and the planarization material is a dielectric material of reflowed phosphosilicate glass having a 6 percent concentration of phosphorus.

34. A semiconductor body as in claim 4, wherein the semiconductor body includes silicon.

35. A semiconductor body as in claim 4, wherein the oxygen diffusion barrier is silicon nitride.

36. A semiconductor body as in claim 4, wherein the fill material is polysilicon, and the planarization material is a dielectric material of reflowed phosphosilicate glass having a 6 percent concentration of phosphorus.

37. A semiconductor body as in claim 4, further comprising:
   a second oxygen diffusion barrier disposed over the fill material and over the semiconductor body contiguous surface region.

38. A semiconductor body as in claim 4, wherein the fill material includes a surface facing away from an interior of the body, and the layer of planarization material is disposed on the oxygen diffusion barrier over the semiconductor body contiguous surface region and on the fill material surface.

39. A semiconductor body as in claim 4, further comprising:
   a second oxygen diffusion barrier disposed over the fill material and on the oxygen diffusion barrier portion over the semiconductor body contiguous surface region.

40. A semiconductor body as in claim 4, further comprising:
   integrated circuit elements disposed in the semiconductor body.

41. The semiconductor body of claim 11 wherein the layer of flowed planarization material is is a dielectric material of reflowed phosphosilicate glass having a 6 percent concentration of phosphorus.

42. A semiconductor body as in claim 16, further comprising:
   integrated circuit elements disposed in the semiconductor body.

43. A semiconductor body as in claim 16, wherein the oxygen diffusion barrier is silicon nitride.

44. A semiconductor body as in claim 16, wherein the fill material is polysilicon, and the planarization material is a dielectric material of reflowed phosphosilicate glass having a 6 percent concentration of phosphorus.

45. A semiconductor body as in claim 16, wherein the fill material includes a surface facing away from an interior of the body, and the layer of planarization material is disposed on the first oxygen diffusion barrier over the semiconductor surface proximate to the intersecton of the semiconductor surface and trench side wall and on the fill material surface.

46. An integrated circuit body as in claim 20, wherein the integrated circuit body includes silicon, the first and second oxygen diffusion barriers are silicon nitride, the fill material is polysilicon, and the dielectric material is reflowed phosphosilicate glass having a 6 percent concentration of phosphorus.

47. An integrated circuit body as in claim 20, further comprising:
   integrated circuit elements disposed in the integrated circuit body.

* * * * *